United States Patent [19]
Tokito

[11] Patent Number: 6,014,225
[45] Date of Patent: Jan. 11, 2000

[54] FRAME BUFFER CONTROL METHOD AND CIRCUIT

[75] Inventor: Yasuo Tokito, Tokyo, Japan

[73] Assignee: Oki Data Corporation, Tokyo, Japan

[21] Appl. No.: 09/019,322

[22] Filed: Feb. 5, 1998

[30] Foreign Application Priority Data

Feb. 20, 1997 [JP] Japan ..................................... 9-035828

[51] Int. Cl.[7] .................................................. G06K 15/00
[52] U.S. Cl. ......................................... 358/1.16; 358/1.17
[58] Field of Search ..................................... 395/101, 102,
395/112, 114, 117, 115, 116; 345/510, 188,
191, 517, 508, 511, 202; 382/297, 305,
282–284; 358/402, 444, 261.4

[56] References Cited

U.S. PATENT DOCUMENTS

5,068,904   11/1991   Yamazaki ................................... 382/46

*Primary Examiner*—Arthur G. Evans
*Attorney, Agent, or Firm*—Akin, Gump, Strauss, Hauer & Feld, L.L.P.

[57] ABSTRACT

A frame buffer control circuit interchanges at least one row address bit with at least one column address bit. In operations such as access to bit-mapped character data, the interchange reduces the number of different row addresses that have to be generated, thereby speeding up access to the frame buffer.

8 Claims, 7 Drawing Sheets

FRAME BUFFER CONTROL METHOD AND CIRCUIT

BACKGROUND OF THE INVENTION

The present invention relates to a frame buffer control method and circuit useful in, for example, a page printer.

A page printer has a memory referred to as a frame buffer in which a bit-mapped image of a printed page, or part of a printed page, can be stored. The frame buffer may also be used to store bit maps of characters and symbols. The frame buffer typically comprises dynamic random-access memory (DRAM) devices, which are accessed according to multiplexed row and column addresses output by a frame buffer control circuit.

Many DRAM devices have a mode of operation, referred to as a fast page mode, in which input of a row address is followed by input of multiple column addresses. Fast page mode allows data to be accessed rapidly, as long as the access stays within the same row.

A problem in conventional page printers is that access does not tend to stay in the same row. Even the simple operation of copying the bit map of one character, to place the character on a printed page, typically requires access to several different rows. The operation of the printer is accordingly slowed by the need to switch repeatedly from one row address to another, with attendant delays for activating different rows of memory cells.

SUMMARY OF THE INVENTION

An object of the present invention is to speed up operations on bit-mapped data by allowing a frame buffer to be accessed with less switching between different row addresses.

The invented method of controlling access to a frame buffer comprises the steps of:

interchanging at least one bit in a received high-order group of address bits with at least one bit in a received low-order group of address bits;

supplying the resulting new high-order group of address bits to the frame buffer as row address bits; and supplying the resulting new low-order group of address bits to the frame buffer as column address bits.

In the invented frame buffer control circuit, the interchanging is accomplished by one or more pairs of crossed signal lines. An access controller compares the row address bits with the row address bits received in a previous access, and controls a selector so that the row address bits are supplied to the frame buffer only when they differ from the row address bits in the previous access.

The interchange of address bits has the effect of replacing high-order address bits that tend to change value frequently, in operations such as access to bit-mapped characters, with low-order address bits that tend not to change value in those operations, thereby reducing the amount of switching between different row addresses.

DETAILED DESCRIPTION OF THE INVENTION

Embodiments of the invention will be described with reference to the attached exemplary drawings.

Figure 1:
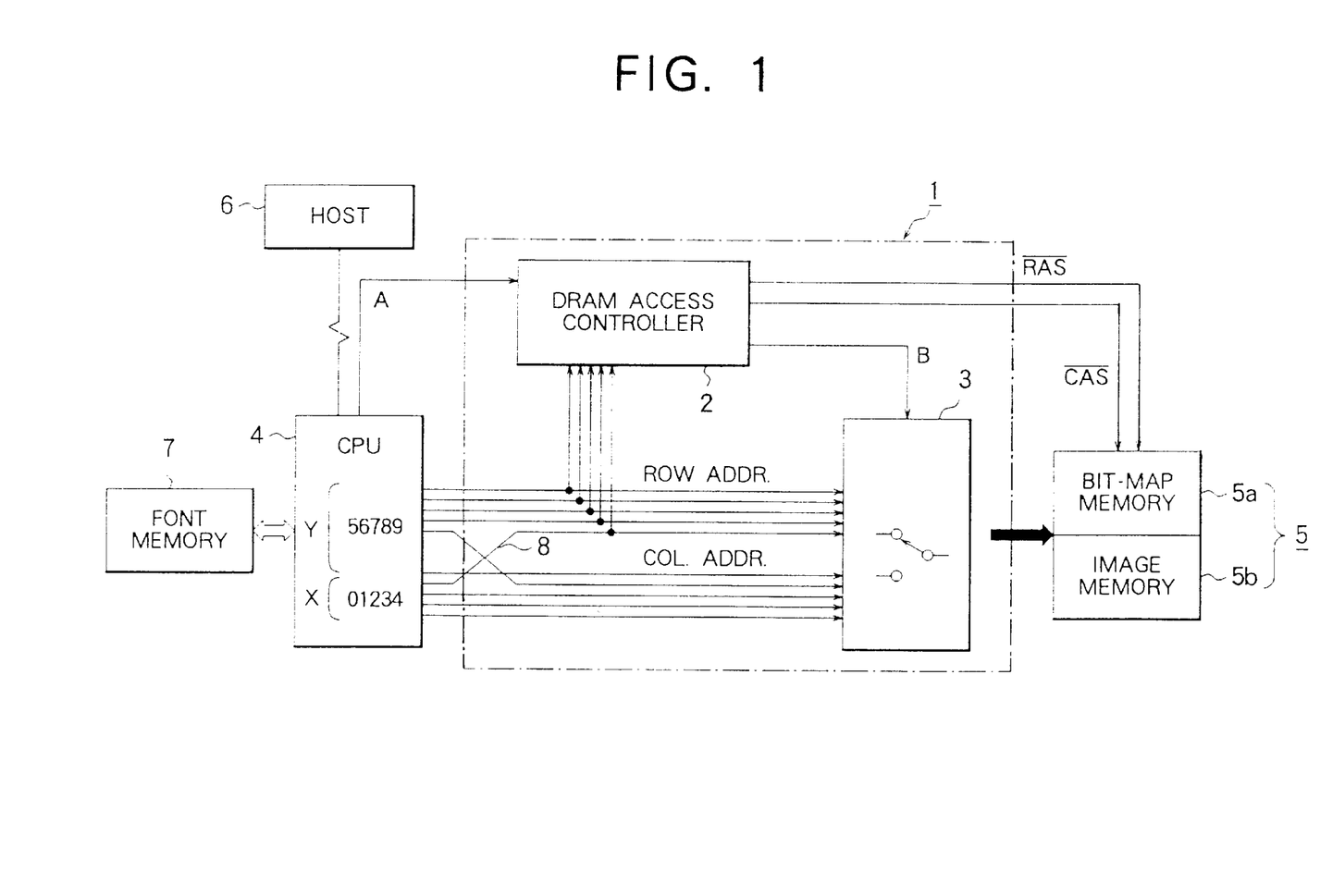
FIG. 1 is a block diagram showing a frame buffer control circuit in a first embodiment of the invention.

Referring to FIG. 1, the invented frame buffer control circuit 1 comprises a DRAM access controller 2 and a selector 3. The frame buffer control circuit 1 receives address signals from a central processing unit (CPU) 4, and supplies address signals and address strobe signals to a frame buffer 5 comprising one or more DRAM devices with a fast page mode. The frame buffer 5 is divided into a bit-map area 5a, referred to below as a bit-map memory, and an image area 5b, referred to below as an image memory.

Upon receiving page description data from a host device 6 such as a computer, the CPU 4 constructs a bit-mapped image of the page in the image memory 5b. When the page description includes character code data, the CPU 4 copies the corresponding bit-mapped characters from the bit-map memory 5a to the image memory 5b. The CPU 4 generates the bit-mapped characters in the bit-map memory 5a in advance, from mathematical data stored in a font memory 7.

The CPU 4 designates addresses in the frame buffer 5 by means of ten address bits $b_0$ to $b_9$. Bit $b_0$ is the least significant address bit, $b_1$ is the next most significant address bit, and so on up to $b_9$, which is the most significant address bit. The addresses run from zero to one thousand twenty-three (0–1023). It will be assumed below that sixteen bits of data are stored at each address; that is, the word size of the frame buffer 5 is sixteen bits. The CPU 4 uses address bits $b_0$ to $b_3$ to designate horizontal positions (X) on the printed page, and bits $b_4$ to $b_9$ to designate vertical positions (Y).

The numbers above are given only as examples. In practice, the CPU 4 may generate more than ten address bits, and the word size is not restricted to sixteen bits.

Of the address bits output by the CPU 4, bits $b_0$, $b_1$, $b_2$, $b_4$, and $b_5$ are supplied as column address bits to the selector 3. Bits $b_3$, $b_6$, $b_7$, $b_8$, and $b_9$ are supplied as row address bits to both the DRAM access controller 2 and selector 3. When these address bits reach the frame buffer 5 through the selector 3, bit $b_0$ is still the least significant address bit and $b_9$ is the most significant bit, but among the intervening bits, the positions of bits $b_3$ and $b_5$ are interchanged.

To put this differently, the CPU 4 generates a low-order group of bits, from bit $b_0$ to bit $b_4$, which would conventionally become column address bits, and a high-order group of bits, from bit $b_5$ to bit $b_9$, which would conventionally become row address bits. The frame buffer control circuit 1 alters the conventional usage of the bits by interchanging bits $b_3$ and $b_5$, as indicated by the crossed signal lines 8 in the drawing, thereby creating a new high-order group of address bits, used as row address (ROW ADDR.) bits, and a new low-order group of bits, used as column address (COL. ADDR.) bits.

The choice of bits $b_3$ and $b_5$ is not arbitrary. Bit $b_5$ is chosen for interchange because it is the lowest-order bit in the high-order group. Bit $b_3$ is chosen because it is the highest-order bit used to indicate the X direction in the low-order group.

The CPU 4 outputs all ten address bits at once, accompanied by an access start signal A. The DRAM access controller 2 receives the row address bits and access start signal A, temporarily stores the row address value in an internal register (not visible), sends a selection signal B to the selector 3, and sends a row address strobe signal ($\overline{RAS}$) and column address strobe signal ($\overline{CAS}$) to the frame buffer 5. In response to the selection signal B, the selector 3 selects either the row address bits or the column address bits, and sends the selected address bits to the frame buffer 5. The frame buffer 5 latches the address bits output by the selector 3 in synchronization with the strobe signals output by the DRAM access controller 2.

Figure 2:
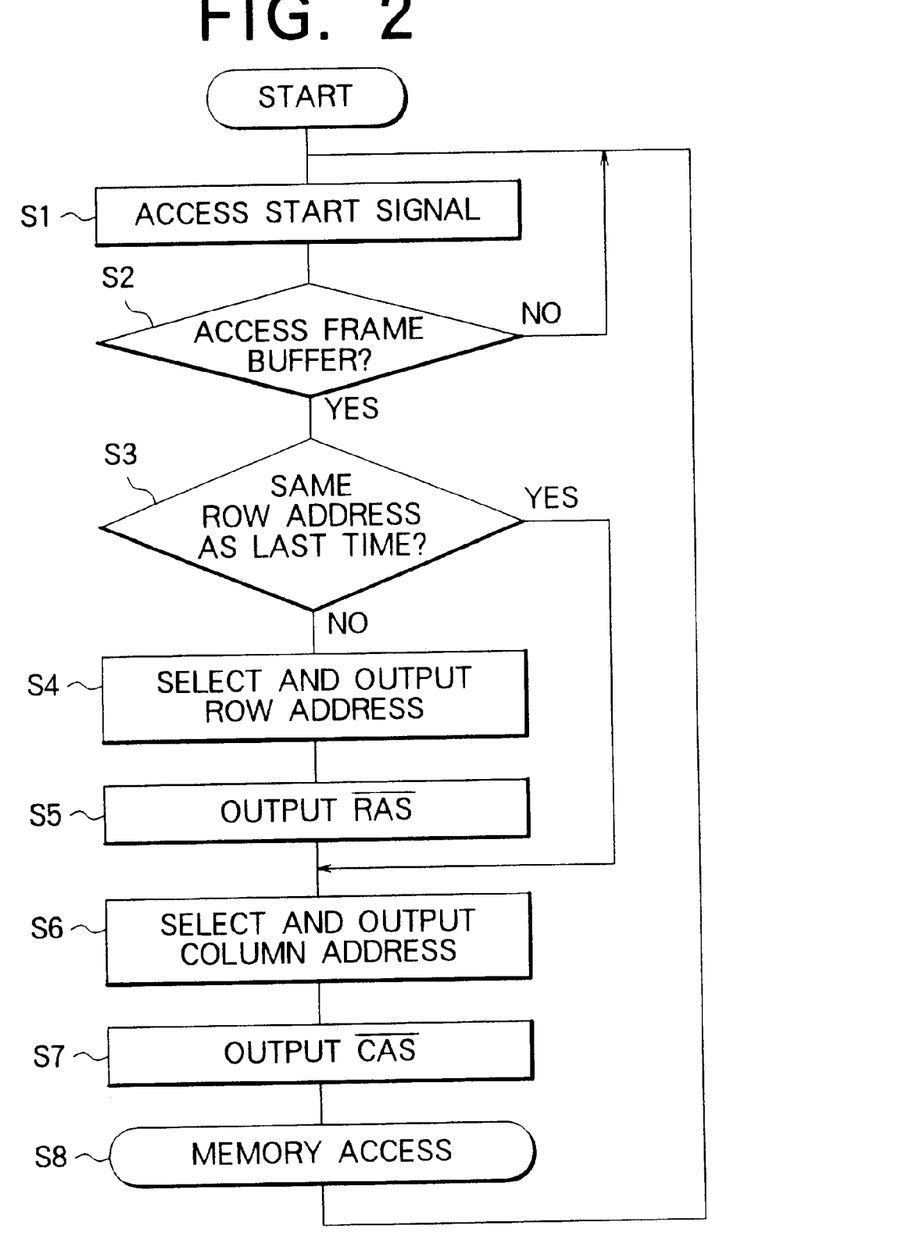
FIG. 2 is a flowchart illustrating the operation of the first embodiment.

Next the operation of the first embodiment will be described with reference to the flowchart in FIG. 2.

In step S1, the DRAM access controller 2 receives an access start signal A from the CPU 4, accompanied by row address bits. In step S2, the DRAM access controller 2 determines whether the access is directed to the frame buffer 5 controlled by the frame buffer control circuit 1. This determination is made, for example, on the basis of further address bits output by the CPU 4, not shown in the drawings. If the access is not directed to the frame buffer 5 (if the access is directed to the font memory 7, for example), the subsequent steps S3 to S8 are skipped.

If the access is directed to the frame buffer 5, in step S3, the DRAM access controller 2 compares the received row address with the row address received at the last previous access. If the two row addresses are the same, the DRAM access controller 2 skips to step S6. If the two row addresses are not the same, in step S4 the DRAM access controller 2 sets the selection signal B to a certain state, causing the selector 3 to send the row address bits to the frame buffer 5, and in step S5 the DRAM access controller 2 activates the row address strobe signal $\overline{RAS}$.

In step S6, the DRAM access controller 2 sets the selection signal B to another state, causing the selector 3 to send the column address bits to the frame buffer 5, and in step S7 the DRAM access controller 2 activates the column address strobe signal $\overline{CAS}$. In step S8, memory access (read access or write access) is carried out at the column address output in step S6, and at the row address output at either the present access or a previous access in step S4.

When a series of words in the same row is accessed, the DRAM access controller 2 detects the matching row addresses in step S3, and the selector 3 outputs a row address to the frame buffer 5 only for the first word in the series, allowing the other words to be accessed quickly in the fast page mode.

The above operation will next be illustrated for access to a series of eight words containing the bit map of a character.

Figure 3:
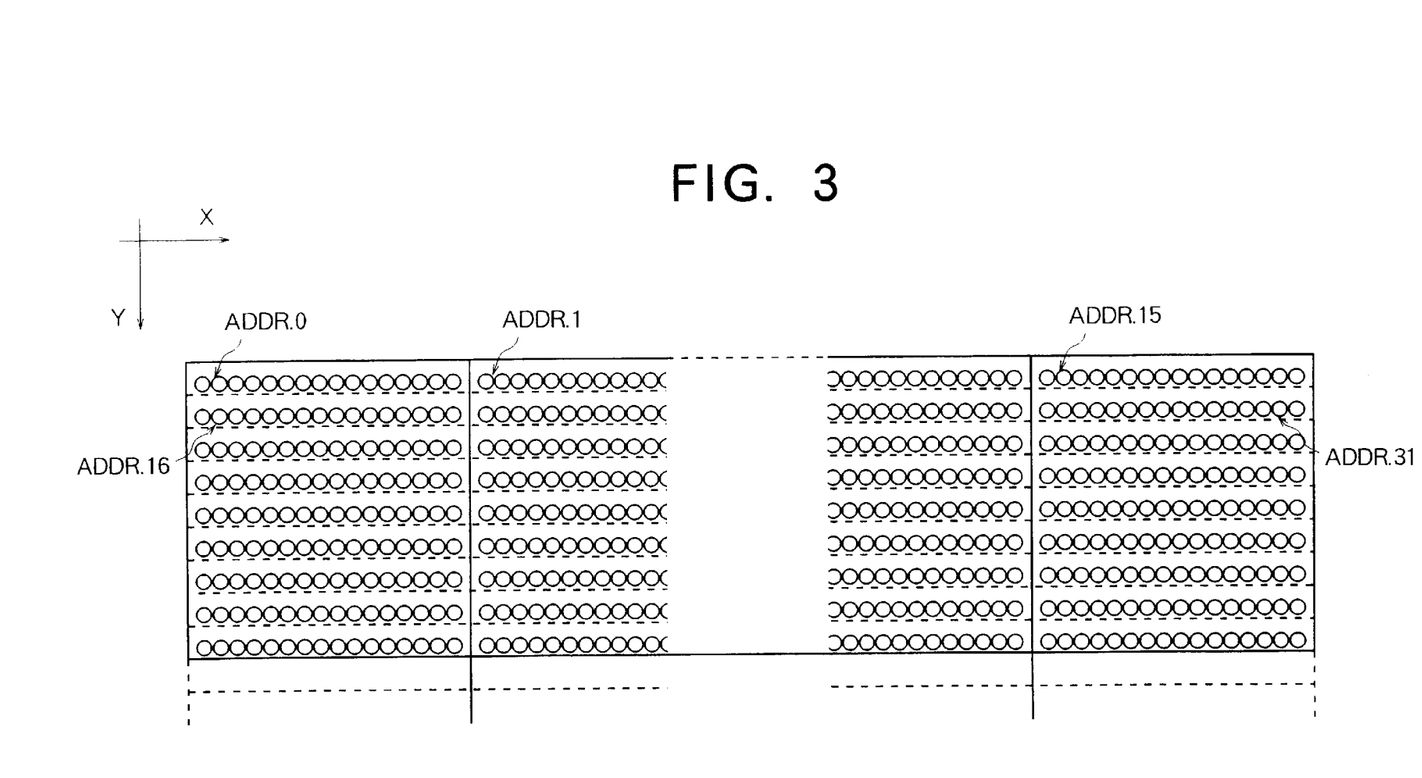
FIG. 3 illustrates the storage of bit-mapped data in the frame buffer in the first embodiment.

FIG. 3 indicates how bit-mapped data are stored in the frame buffer 5. The letters X and Y indicate the horizontal and vertical directions on the printed page. The bit-mapped data represent a rectangular plane that extends, for example, two hundred fifty-six bits in the X direction, and sixty-four bits in the Y direction. Since the word size is sixteen bits, the two hundred fifty-six bits in each horizontal line are stored in sixteen words (16×16=256).

The data for one horizontal line occupy sixteen consecutive addresses, as output by the CPU 4, before the interchange of bits $b_3$ and $b_5$ in the frame buffer control circuit 1. For example, the data for the first horizontal line are stored at addresses zero to fifteen as output by the CPU 4. The data for the next line are stored at addresses sixteen to thirty-one as output by the CPU 4.

Figure 4:
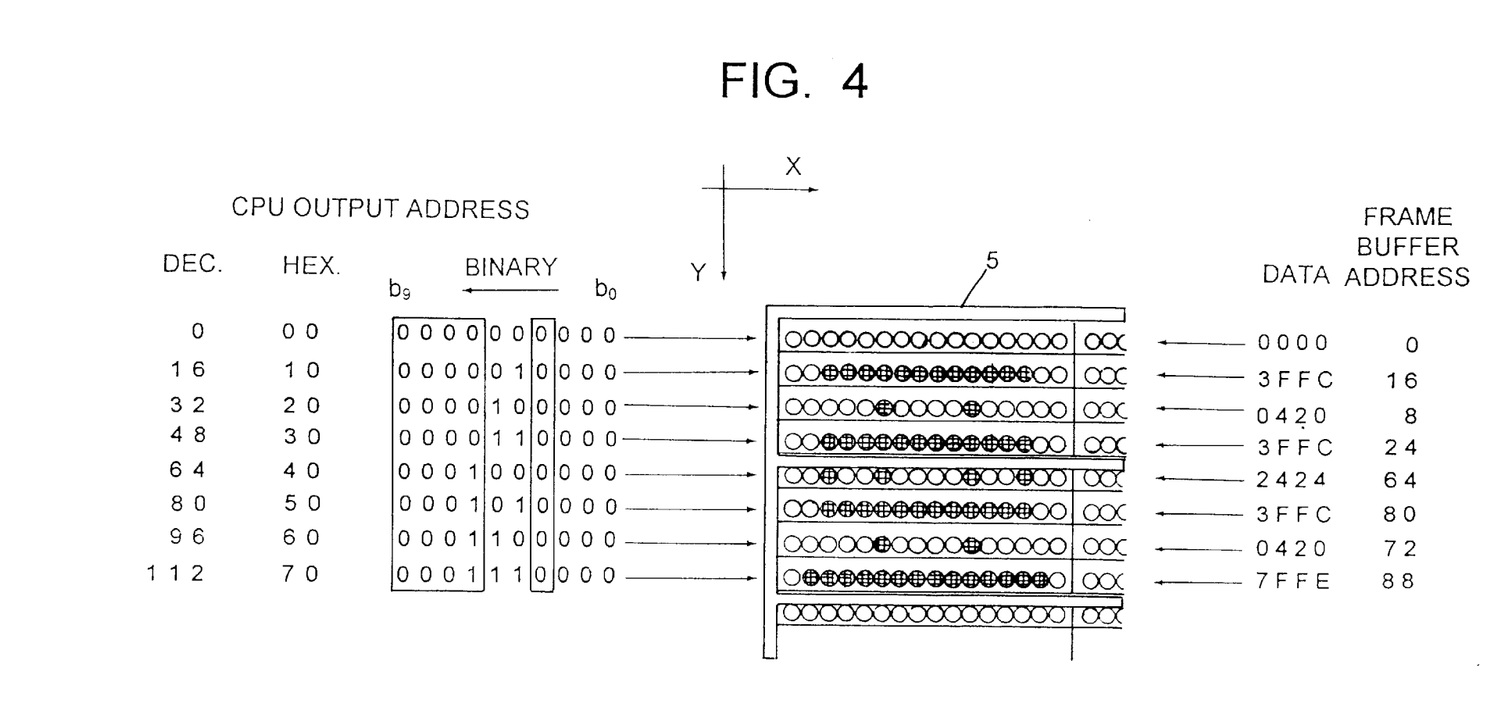
FIG. 4 illustrates addresses generated to access one bit-mapped character in the first embodiment.

FIG. 4 shows a bit map for the Japanese character representing the letter A in the word Asia, stored in the top left position of the X-Y plane. The bit comprises eight sixteen-bit words, which are stored at addresses zero, sixteen, thirty-two, forty-eight, and so on in multiples of sixteen up to one hundred twelve, as output by the CPU 4. These addresses are shown in decimal, hexadecimal, and binary notation to the left of the bit map. The data stored at these address are indicated in hexadecimal notation to the right of the bit map. The addresses received by the frame buffer 5, after the interchange of bits $b_3$ and $b_5$, are shown in decimal notation to the right of the data.

In the binary addresses output by the CPU 4, the row address bits are enclosed in rectangular outlines. The eight words are located at only two different row addresses, as indicated by the thick lines in the bit map. Since the first four words are all located at the same row address (00000), the frame buffer control circuit 1 outputs a row address for only the first of these four words. The other three words are accessed in the fast page mode, by column addresses alone. Similarly, the second four words are all located at the same row address (00010), and three of these four words are accessed in the fast page mode. In all, six of the eight words are accessed in the fast page mode.

Figure 5:
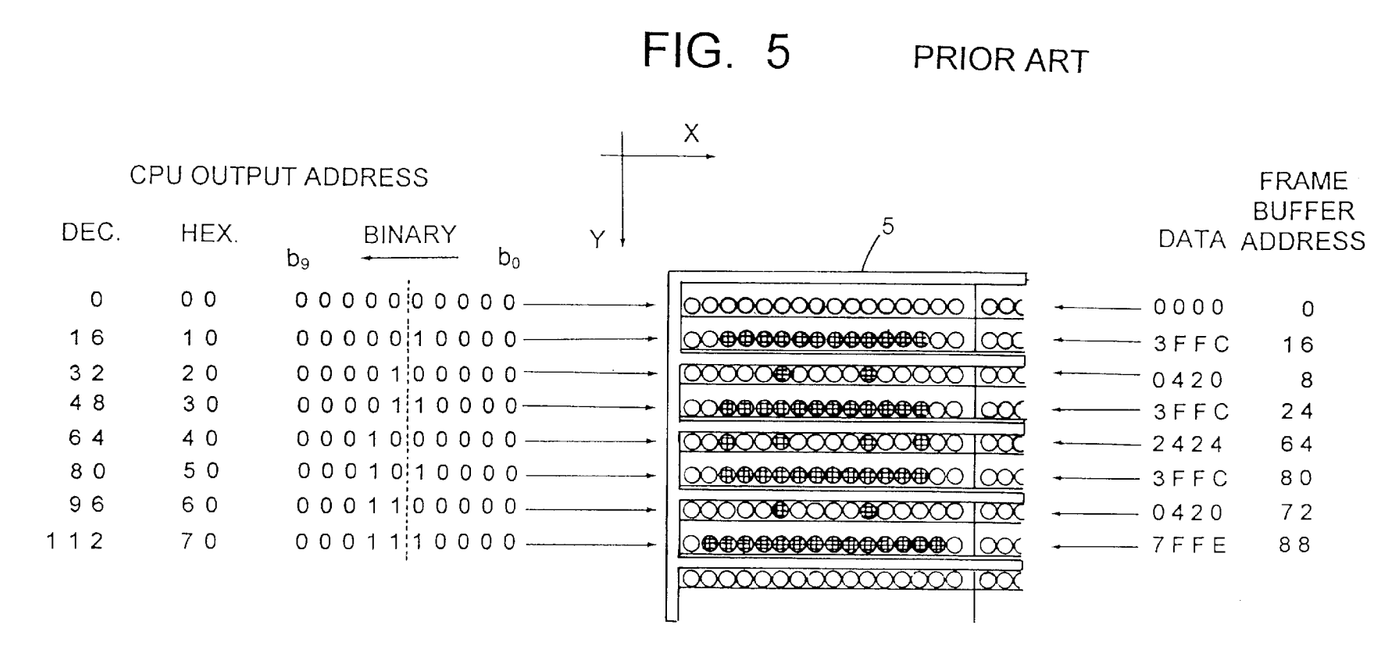
FIG. 5 illustrates addresses generated to access one bit-mapped character in a conventional page printer.

For comparison, FIG. 5 shows the same eight words as accessed using a conventional frame buffer control circuit that does not interchange address bits. A dotted line divides the binary address bits output by the CPU 4 into a low-order group (bits $b_0$ to $b_4$), used as column address bits, and a high-order group (bits $b_5$ to $b_9$), used as row address bits. The eight data words are now stored at four different row addresses, as indicated by the thick lines in the bit map, requiring the output of four different row addresses. The fast page mode can be used for only four of the eight data words.

By increasing the amount of data that can be accessed in the fast page mode in typical printer operations such as the one illustrated above, the first embodiment can significantly increase the speed of those operations. This increase is moreover obtained without the need to modify the printer's software. The addresses output by the CPU 4 are the same in the first embodiment (FIG. 4) as in the conventional case (FIG. 5).

Figure 6:
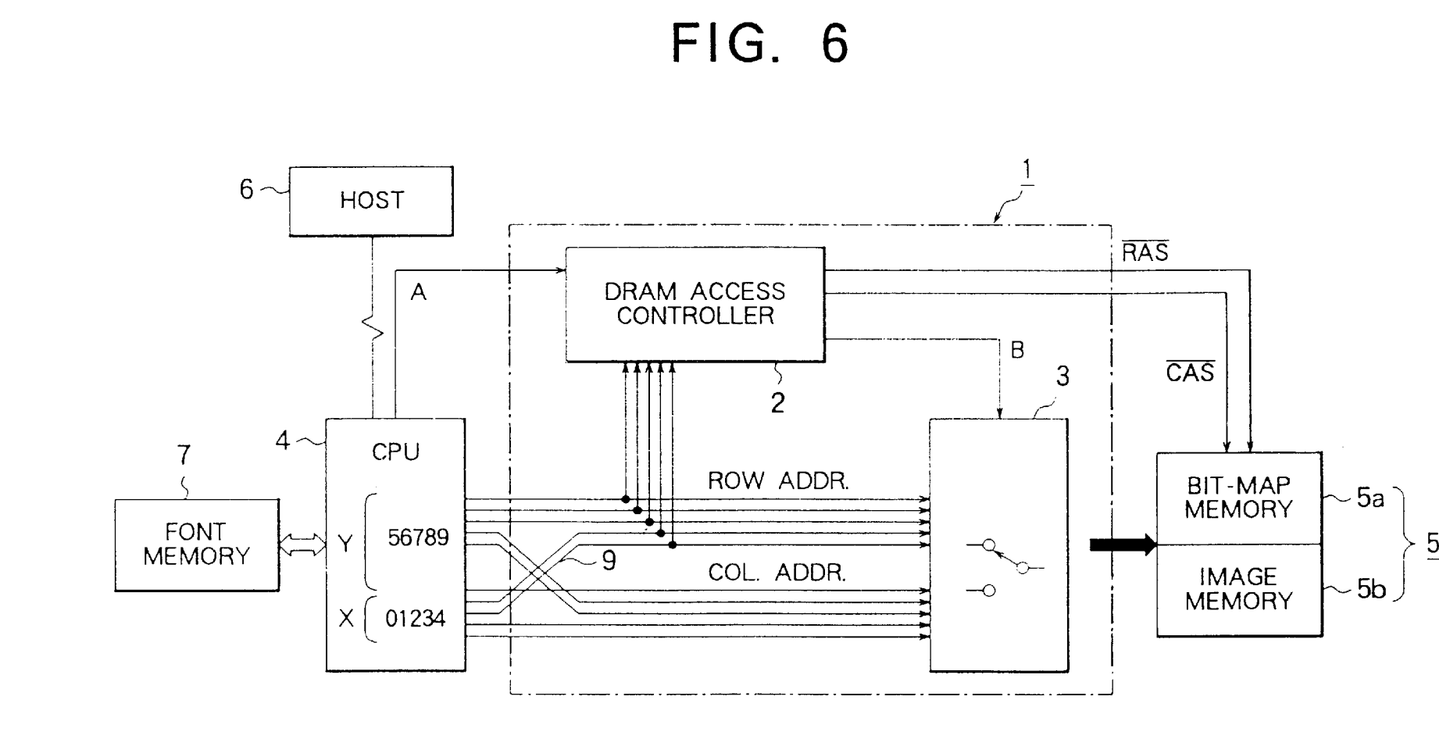
FIG. 6 is a block diagram showing a frame buffer control circuit in a second embodiment of the invention.

FIG. 6 illustrates a second embodiment of the invention, using the same reference numerals as in FIG. 1 for identical elements. The difference between the first and second embodiments is that in the second embodiment, more address bits are interchanged. Specifically, bits $b_2$ and $b_3$ are interchanged with bits $b_5$ and $b_6$, as indicated by the crossed signal lines 9. Aside from this difference, the second embodiment operates in the same way as the first embodiment.

Figure 7:
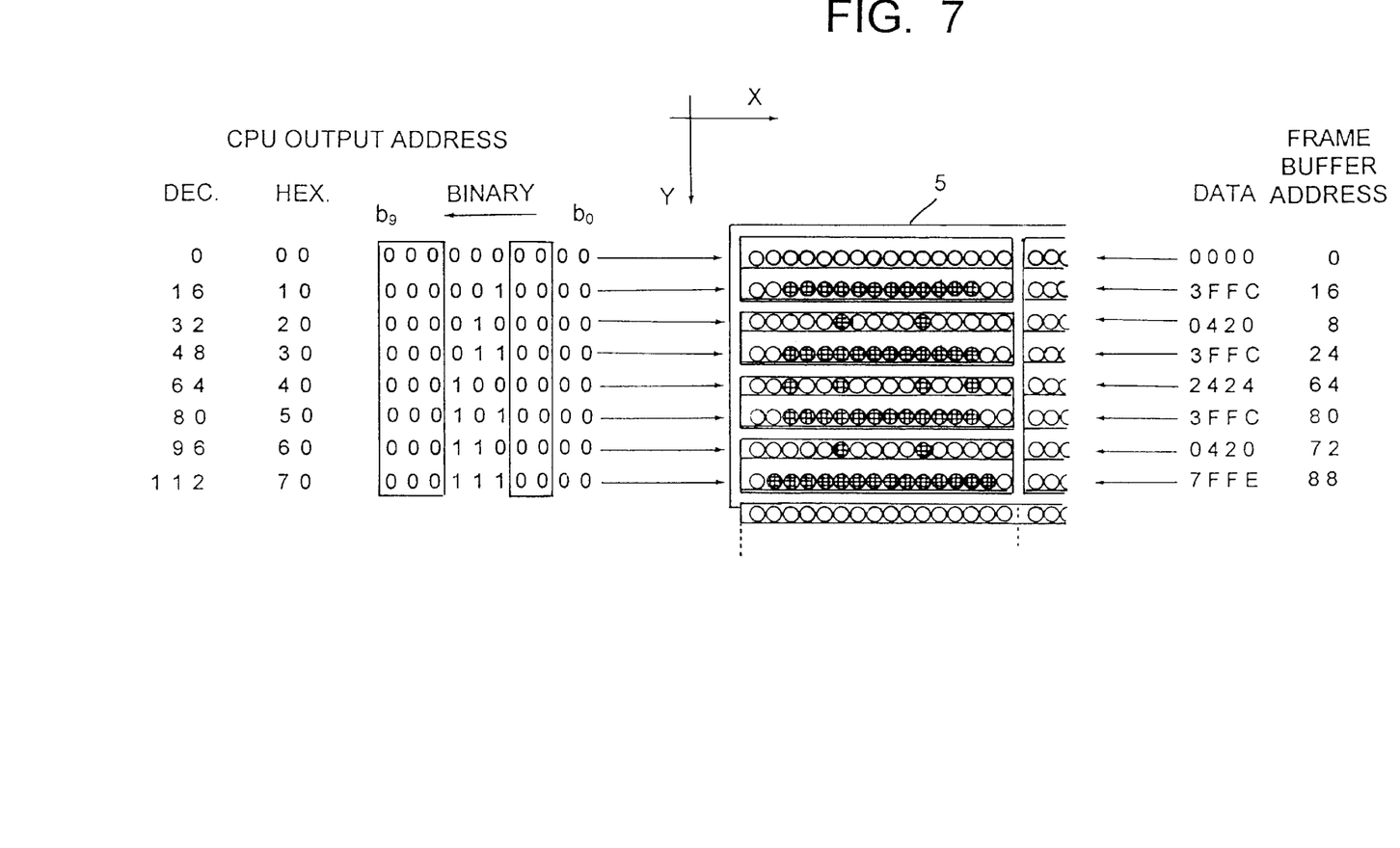
FIG. 7 illustrates addresses generated to access one bit-mapped character in the second embodiment.

FIG. 7 illustrates access in the second embodiment to the same eight-word bit map as shown in the first embodiment. Row address bits are again enclosed in rectangular outlines in the binary address data output by the CPU 4. The row addresses of all eight words are the same (00000), so the frame buffer control circuit 1 outputs only one row address, covering the entire access operation. Seven of the eight words are accessed in the fast page mode, by column address only.

A comparison of FIGS. 4, 5, and 7 shows an increase in the amount of data accessed in fast page mode from fifty percent in the conventional case to seventy-five percent in the first embodiment, and substantially eighty-eight percent in the second embodiment. The amount of data accessed in the row-address mode is accordingly fully fifty percent in the conventional case, but only twenty-five percent in the first embodiment, and only about twelve percent in the second embodiment. Since the row-address access mode is considerably slower than the fast page mode, the invention can lead to a significant speed-up of printer operations.

The invention is not limited to the interchange of just one or two pairs of address bits. In general, an arbitrary subgroup of bits in the low-order group of address bits can be interchanged with an arbitrary subgroup in the high-order group. Preferably a subgroup at the low-order end of the high-order group is interchanged with a subgroup comprising the highest-order bits used to designate the X-direction in the low-order group of address bits.

The invention has been described in relation to fast-page-mode DRAM, but a similar speed-up is obtained if the frame buffer comprises synchronous DRAM or other types of memory devices permitting burst transfer of data from the same row.

Those skilled in the art will recognize that further variations are possible within the scope claimed below.

What is claimed is:

1. A method of controlling access to a frame buffer storing bit-mapped image data, according to a high-order group of address bits and a low-order group of address bits received from a central processing unit, comprising the steps of:

interchanging at least one bit in said high-order group of address bits with at least one bit in said low-order group of address bits, thereby creating a new high-order group of address bits, and a new low-order group of address bits;

supplying said new high-order group of address bits to said frame buffer as row address bits, provided said new high-order group of address bits differ from the new high-order group of address bits in a preceding access; and supplying said new low-order group of address bits to said frame buffer as column address bits.

2. The method of claim 1, wherein said step of interchanging interchanges a certain number of lowest-order bits in said high-order group with a like number of bits in said low-order group.

3. The method of claim 2, wherein the bits interchanged in said low-order group are highest-order bits among bits used to designate a particular direction in said bit-mapped image data.

4. A frame buffer control circuit receiving a high-order group of address bits and a low-order group of address bits from a central processing unit, and providing row address bits and column address bits to a frame buffer in which bit-mapped image data are stored, comprising:

at least one pair of crossed signal lines interchanging at least one bit in said high-order group of address bits with at least one bit in said low-order group of address bits, thereby creating a new high-order group of address bits, and a new low-order group of address bits;

an access controller receiving and temporarily storing said new high-order group of address bits, for comparing the new high-order group of address bits received at one access with the new high-order group of address bits temporarily stored at a preceding access, setting a selection signal to a first state if the received new high-order group of address bits match the temporarily stored new high-order group of address bits, and setting said selection signal first to a second state, then to said first state, if the received new high-order group of address bits do not match the temporarily stored new high-order group of address bits; and a selector coupled to said access controller, for providing said new low-order group of address bits to said frame buffer as column address bits when said selection signal is in said first state, and providing said new high-order group of address bits to said frame buffer as row address bits when said selection signal is in said second state.

5. The frame buffer control circuit of claim 4, wherein said crossed signal lines interchange one lowest-order bit in said high-order group of address bits with one bit in said low-order group of address bits.

6. The frame buffer control circuit of claim 5, wherein the one bit interchanged in said low-order group of address bits is a highest-order bit among bits used to designate a particular direction in said bit-mapped image data.

7. The frame buffer control circuit of claim 4, wherein said crossed signal lines interchange two lowest-order bits in said high-order group of address bits with two bits in said low-order group of address bits.

8. The frame buffer control circuit of claim 7, wherein the two bits interchanged in said low-order group of address bits are two highest-order bits among bits used to designate a particular direction in said bit-mapped image data.

* * * * *